US009526187B2

(12) United States Patent
Nakayama et al.

(10) Patent No.: US 9,526,187 B2
(45) Date of Patent: Dec. 20, 2016

(54) WIRING MODULE

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Osamu Nakayama, Yokkaichi (JP); Mitsutoshi Morita, Yokkaichi (JP); Kotaro Takada, Yokkaichi (JP); Naoki Fukushima, Yokkaichi (JP)

(73) Assignees: AUTONETWORKS TECHNOLOGIES, LTD., MIE (JP); SUMITOMO WIRING SYSTEMS, LTD., MIE (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/773,770

(22) PCT Filed: Mar. 10, 2014

(86) PCT No.: PCT/JP2014/056114
§ 371 (c)(1),
(2) Date: Sep. 9, 2015

(87) PCT Pub. No.: WO2014/156576
PCT Pub. Date: Oct. 2, 2014

(65) Prior Publication Data
US 2016/0021772 A1  Jan. 21, 2016

(30) Foreign Application Priority Data

Mar. 27, 2013 (JP) ................................. 2013-065651

(51) Int. Cl.
*H05K 7/00* (2006.01)
*H01M 2/20* (2006.01)
(Continued)

(52) U.S. Cl.
CPC ............. *H05K 7/005* (2013.01); *H01M 2/206* (2013.01); *H01M 10/486* (2013.01);
(Continued)

(58) Field of Classification Search
CPC ............ H01R 13/6683; H01R 13/6666; H01M 2/206; H01M 2/1077; H01M 10/486; H01M 10/625; H01M 10/65; H01M 2220/20
(Continued)

(56) References Cited

U.S. PATENT DOCUMENTS 8,545,271 B2 * 10/2013 Henmi ................ H01M 2/1083
                                                            439/208
2004/0043663 A1 *  3/2004 Ikeda .................... H01M 2/206
                                                            439/627

(Continued)

FOREIGN PATENT DOCUMENTS

JP    2012-154901 A    8/2012
JP    2013-097962 A    5/2013
(Continued)

OTHER PUBLICATIONS

Apr. 8, 2014 International Search Report issued in International Application No. PCT/JP2014/056114.

*Primary Examiner* — Abdullah Riyami
*Assistant Examiner* — Harshad Patel
(74) *Attorney, Agent, or Firm* — Oliff PLC (57) ABSTRACT

A wiring module to be attached to a power storage element group in which a plurality of power storage elements each having positive and negative electrode terminals are lined up includes: an insulating protector having a connection member holding section for holding a connection member that electrically connects adjacent electrode terminals; a temperature detecting member that is arranged so as to be in contact with the connection member held by the connection member holding section and is configured to detect the temperature of the connection member; a cover configured to cover the insulating protector; and a restricting member configured to restrict movement of the temperature detecting member by covering the insulating protector with the cover.

13 Claims, 11 Drawing Sheets

(51) Int. Cl.
*H01M 10/48* (2006.01)
*H01M 10/625* (2014.01)
*H01M 10/615* (2014.01)
*H01M 10/65* (2014.01)
*H01M 10/613* (2014.01)
*H01M 10/6553* (2014.01)

(52) U.S. Cl.
CPC ....... *H01M 10/613* (2015.04); *H01M 10/615* (2015.04); *H01M 10/625* (2015.04); *H01M 10/65* (2015.04); *H01M 10/6553* (2015.04); *H01M 2220/20* (2013.01)

(58) Field of Classification Search
USPC ........ 361/103, 106, 26, 27, 36, 37; 429/160, 429/121, 61; 439/689, 693, 627, 504, 718
See application file for complete search history.

(56) References Cited

U.S. PATENT DOCUMENTS

| | | | |
|---|---|---|---|
| 2011/0223466 A1* | 9/2011 | Lee ............. | H01M 2/1077 429/158 |
| 2012/0244397 A1* | 9/2012 | Tenhouten ......... | H01M 2/1005 429/61 |
| 2013/0280959 A1 | 10/2013 | Takase et al. | |
| 2013/0309553 A1 | 11/2013 | Kinoshita et al. | |
| 2013/0344377 A1 | 12/2013 | Ogasawara et al. | |
| 2014/0315441 A1* | 10/2014 | Kinoshita ........... | H01M 2/1077 439/627 |
| 2014/0370342 A1* | 12/2014 | Nakayama .......... | H01M 10/482 429/90 |

FOREIGN PATENT DOCUMENTS

| | | |
|---|---|---|
| JP | 2013-143181 A | 7/2013 |
| JP | 2013-161749 A | 8/2013 |
| WO | 2011/142213 A1 | 11/2011 |
| WO | 2012/102373 A1 | 8/2012 |
| WO | 2012/127962 A1 | 9/2012 |

* cited by examiner

WIRING MODULE

CROSS-REFERENCE TO RELATED APPLICATIONS

This application is a National Stage application of International Application No. PCT/JP2014/056114, filed on Mar. 10, 2014, and claims priority to Japanese Patent Application No. 2013-065651 filed on Mar. 27, 2013, the disclosures of both of which are incorporated herein by reference in their entireties.

TECHNICAL FIELD

Embodiments of the present application relate to a wiring module.

BACKGROUND

In power storage modules such as electric cars or hybrid cars, a large number of power storage elements are lined up laterally and connected to each other in order to increase an output. The power storage elements are configured to be connected in series or in parallel to each other by adjacent electrode terminals being connected by connection members such as busbars.

If such a power storage module is used in a high temperature condition, the lifetime thereof may be decreased, and a power storage module in which a plurality of lithium-ion batteries or the like are connected to each other may ignite due to an increase in its temperature when being charged. Accordingly, in order to prevent such a situation, power storage modules are provided with a temperature sensor for detecting the temperature of power storage elements (see JP 2012-154901A, for example).

A temperature sensor disclosed in JP 2012-154901A is molded by insert molding into one piece with a resin module that is attached to a power storage element group constituted by a plurality of power storage elements, and is mounted so as to be in contact with the main bodies of the power storage elements by the resin module being attached to the power storage elements.

SUMMARY OF THE INVENTION

In the temperature sensor having a configuration disclosed in JP 2012-154901A, an operation for attaching the temperature sensor is easy because the temperature sensor is positioned by attaching the resin module to the power storage elements, but there is the problem that the resin module needs to be produced depending on the positions of the power storage elements that serve as temperature detection targets, the number thereof, or the like, resulting in a low degree of freedom.

Accordingly, a configuration is conceivable in which when, for example, a busbar or voltage detection terminal is a temperature detection target, a temperature detecting member is installed so as to be in contact with the busbar or the like that serves as a temperature detection target.

In such a case, the temperature detecting member needs to be held, together with the busbar or the like, by a protector (insulating protector) that is made from an insulating material and for holding the busbar or the like. However, if a structure for holding the temperature detecting member is provided so as not to interfere with a tool for connecting the busbar or the like to an electrode terminal, or the like, the temperature detecting member will need to have a size to be able to be held by the holding structure of the insulating protector, and thus an increase in size of the temperature detecting member will be concerned. If the large-sized temperature detecting member is used, a large-sized insulating protector may also be needed for holding the large-sized temperature detecting member. Furthermore, the holding structure of the temperature detecting member may interfere with the structure for holding the busbar or the like.

Embodiments of the present application have been made in view of the above-described circumstances, and one objective of the present application to suppress, in a wiring module including a temperature detecting member, an increase in size of the temperature detecting member.

In order to solve the above-described problems, the present application is directed to a wiring module to be attached to a power storage element group in which a plurality of power storage elements are lined up, each power storage element having a positive electrode terminal and a negative electrode terminal, the wiring module including: an insulating protector having a connection member holding section for holding a connection member that electrically connects adjacent electrode terminals; a temperature detecting member that is arranged so as to be in contact with the connection member held by the connection member holding section, and is configured to detect the temperature of the connection member; a cover configured to cover the insulating protector; and a restricting member configured to restrict movement of the temperature detecting member by covering the insulating protector with the cover.

According to embodiments of the present application, it is configured such that when the temperature detecting member for detecting the temperature of the connection member is arranged so as to be in contact with the connection member held by the connection member holding section of the insulating protector and then the cover is attached, movement of the temperature detecting member is restricted by the restricting member.

According to embodiments of the present application, it is thus possible to hold the temperature detecting member in the state in which its movement is restricted without providing a structure for holding the temperature detecting member for the insulating protector, suppressing, in the wiring module including a temperature detecting member, an increase in size of the temperature detecting member.

The present application may also have the following configuration.

The restricting member may be formed into one piece with the cover.

With such a configuration, only by an operation for attaching the cover, movement of the temperature detecting member is restricted by the restricting member, allowing simplification of an operation for holding the temperature detecting member.

The cover may be provided with a latched section that is latched to the insulating protector. With such a configuration, since the cover is latched to the insulating protector, it is possible to maintain the state in which movement of the temperature detecting member is restricted.

The connection member holding section may be provided with a positioning section that is obtained by cutting out a part of the connection member holding section, and is configured to receive and position a part of the temperature detecting member. With such a configuration, the temperature detecting member is received and positioned by the cutout section, and thus causing no interference problem between the positioning section and another member.

According to embodiments of the present application, it is possible to suppress, in a wiring module including a temperature detecting member, an increase in size of the temperature detecting member.

DESCRIPTION OF EMBODIMENTS

Embodiment 1

Embodiment 1 of the present application will be described with reference to FIGS. 1 to 11. A battery module M1 (an example of a power storage module) according to the present embodiment is mounted on a vehicle (not shown) such as an electric car or hybrid car, and is used as an electric power source for driving the vehicle.

The battery module M1 includes a single cell group 10 (an example of a power storage element group) in which a plurality of cell packs 11 (an example of a power storage element) are lined up, and a wiring module 20 that is attached to the single cell group 10. In the following description, if there are a plurality of the same members, a reference numeral may be given to one member and be omitted for the other members.

Single Cell Group 10

Figure 1:
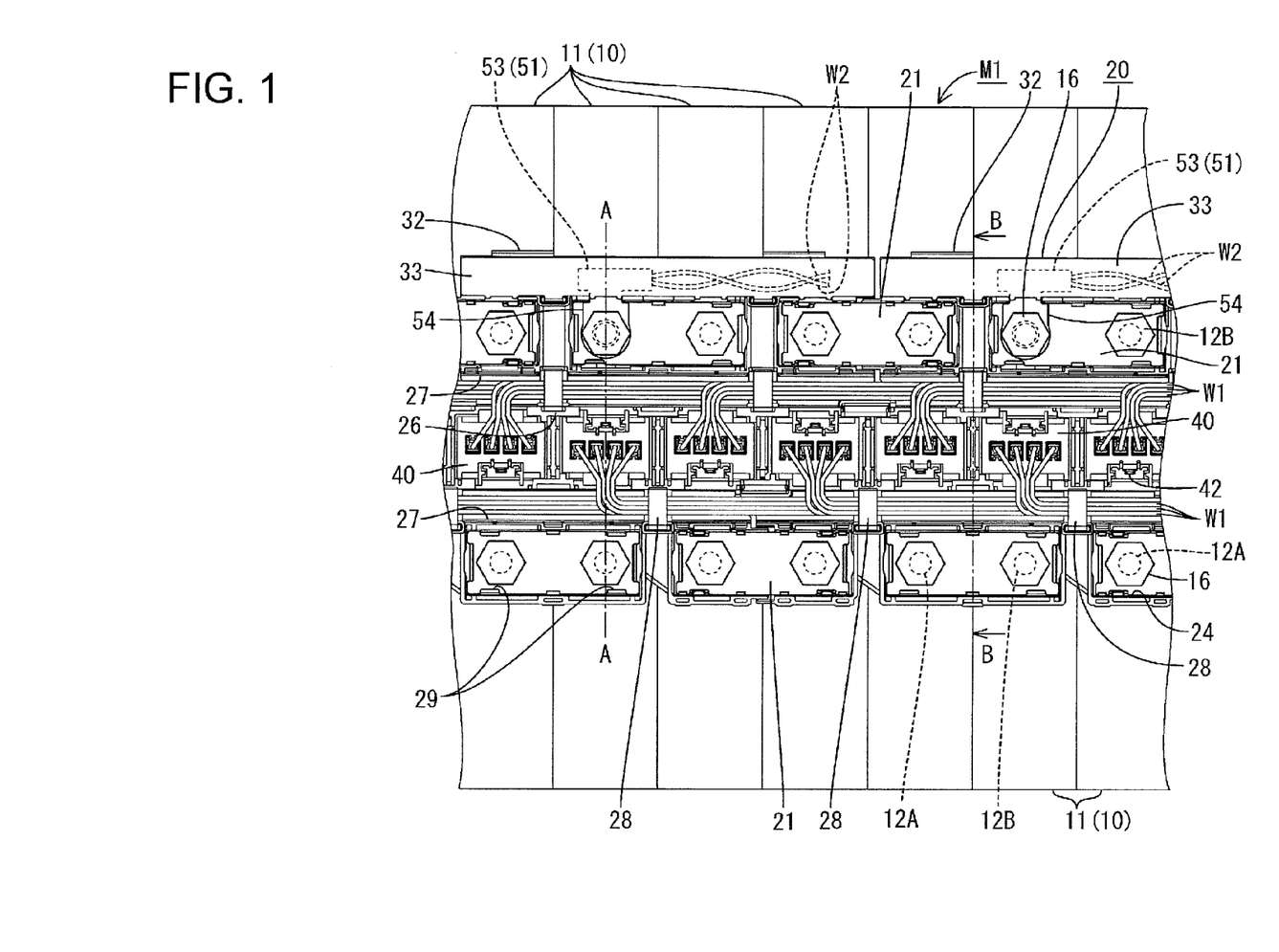
FIG. 1 is a partial plan view illustrating a battery module to which a wiring module according to Embodiment 1 is attached.

As shown in FIG. 1, the battery module M1 of the present embodiment includes the single cell group 10 in which a plurality of cell packs 11 are lined up, the plurality of cell packs each including four single cells (not shown) connected in series to each other. In the present embodiment, each single cell is a thin laminated-type single cell and accommodates a power generating element therein.

Each cell pack 11 has a flat and substantially rectangular parallelepiped shape, and electrode terminals 12A and 12B, which are positive and negative electrodes, are formed projecting from the upper surface of this cell pack, as show in FIG. 1. The positive electrode terminal 12A and the negative electrode terminal 12B have the same shape and size. Each of the electrode terminals 12A and 12B has the shape of a hole, and has a thread (not shown) into which the thread of a bolt 16 can be screwed to connect the corresponding electrode terminal to a connection member 21 (described later). The plurality of cell packs 11 are arranged such that adjacent electrode terminals 12A and 12B have different polarities.

Figure 2:
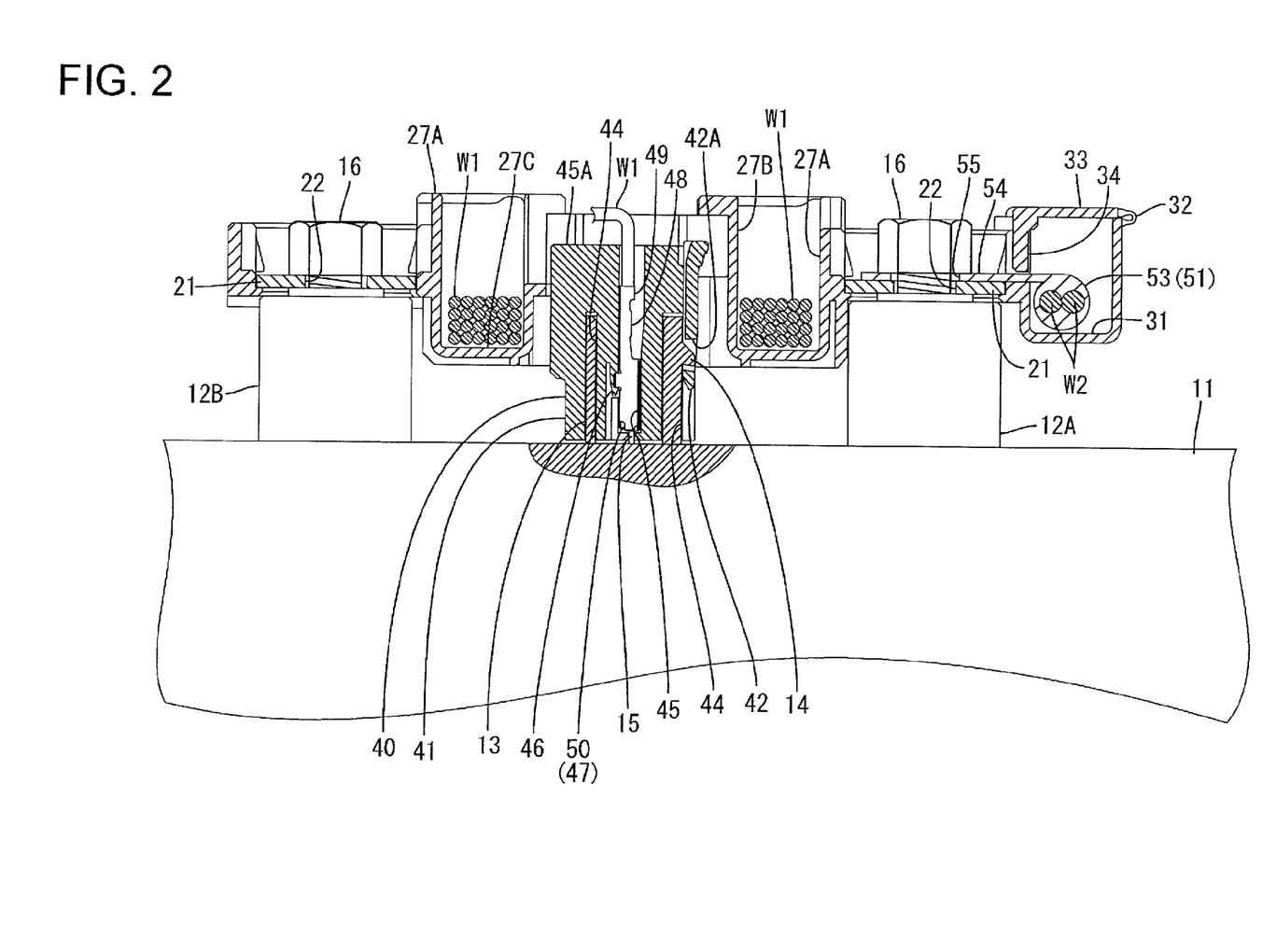
FIG. 2 is a partial cross-sectional view taken along the line A-A of FIG. 1.

As shown in FIG. 2, a tubular connector section 13 that opens upward is provided between the positive electrode terminal 12A and the negative electrode terminal 12B. The outer wall of the connector section 13 is provided with a latching protrusion 14 for latching a connector 40 (fitting counterpart), as shown in FIG. 2.

In each connector section 13, male terminals 15 connected to the corresponding single cells are protruding. That is, in one connector section 13, four terminals 15 are protruding. The four terminals 15 arranged in the connector section 13 are configured to be electrically connected to terminals 47 of the counterpart connector 40.

Wiring Module 20

The wiring module 20 includes a plurality of metal connection members 21 that are connected to the positive electrode terminal 12A and the negative electrode terminal 12B of adjacent cell packs 11, an insulating protector 23 that is made from an insulating material and includes connection member holding sections 24 for holding the connection members 21, and temperature detecting members 51 for detecting the temperature of the connection members 21.

Connection Member 21

Figure 5:
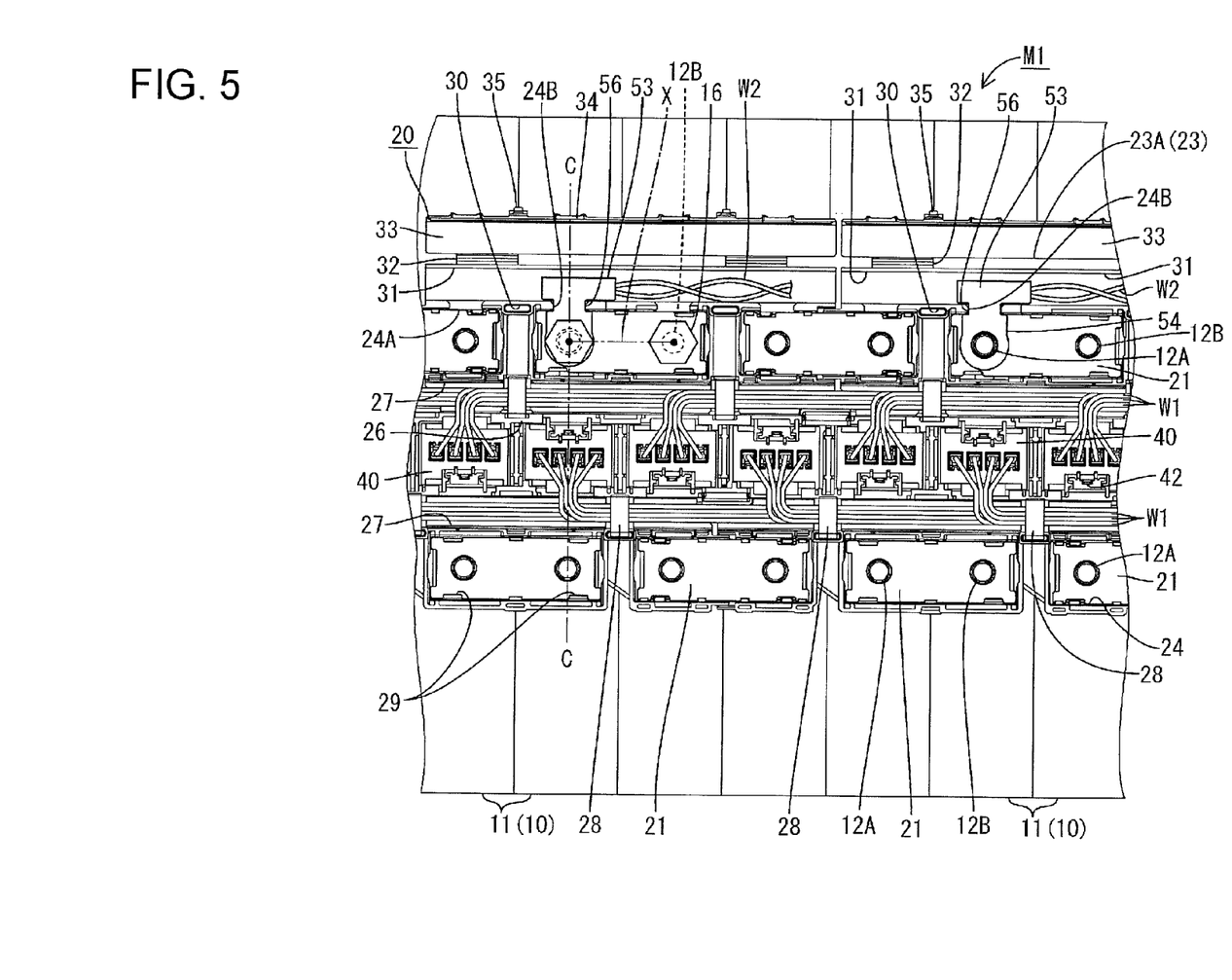
FIG. 5 is a partial plan view illustrating the battery module including the wiring module with its flaps open.
Figure 6:
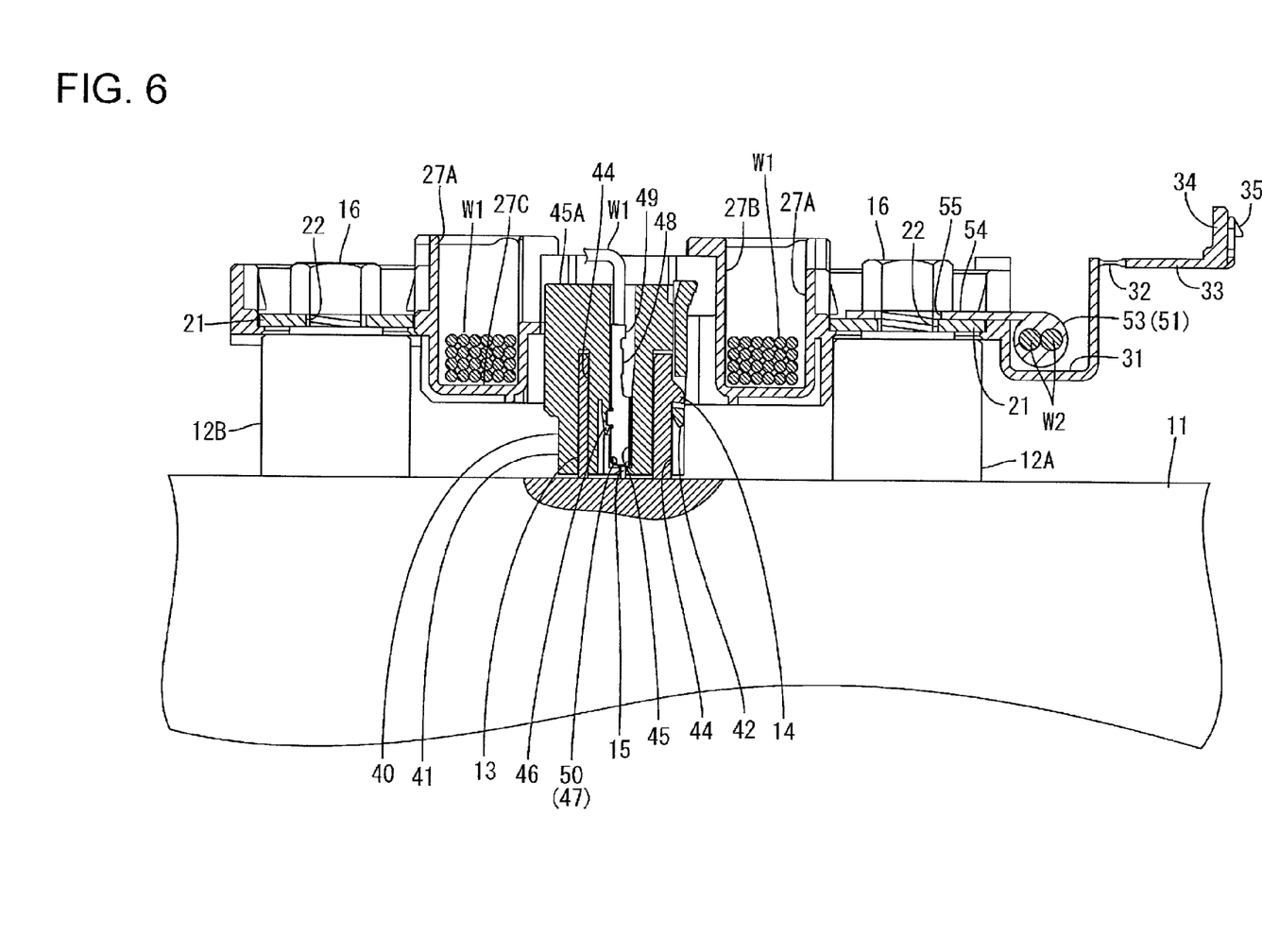
FIG. 6 is a partial cross-sectional view taken along the line C-C of FIG. 5.
Figure 7:
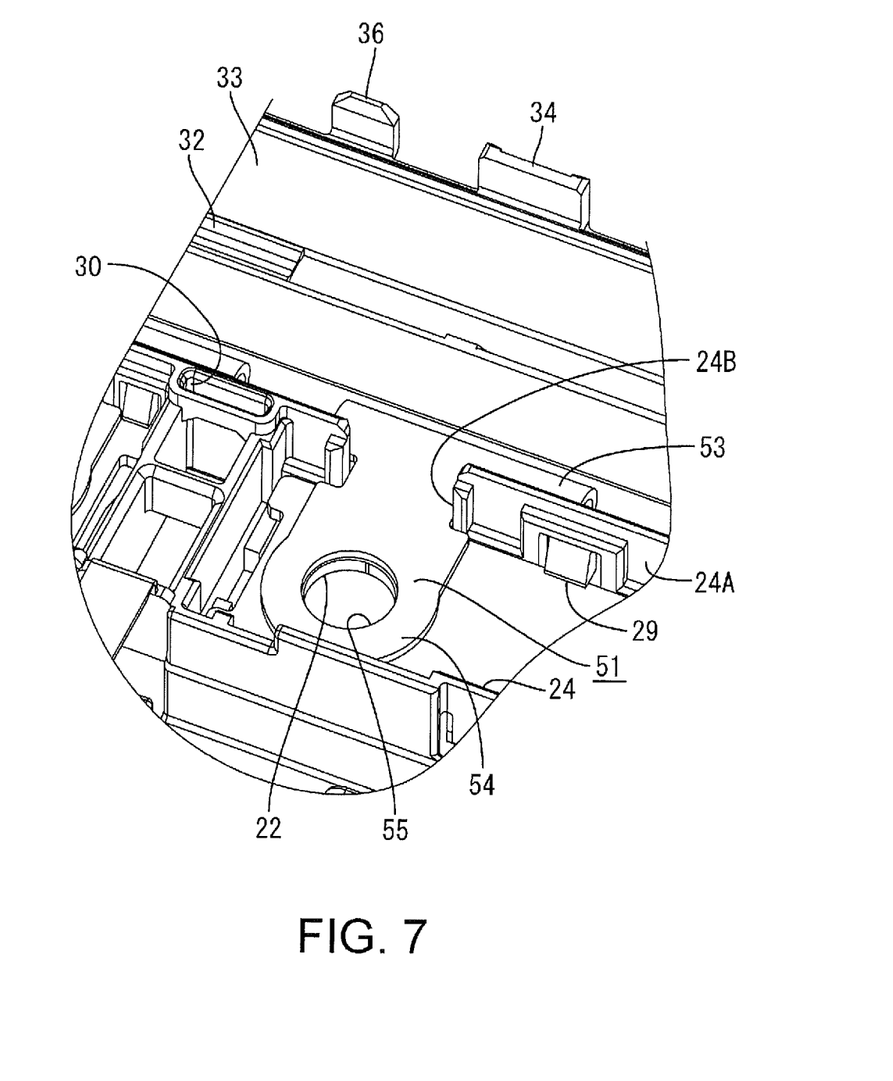
FIG. 7 is a partial perspective view illustrating the battery module with its flaps open.
Figure 8:
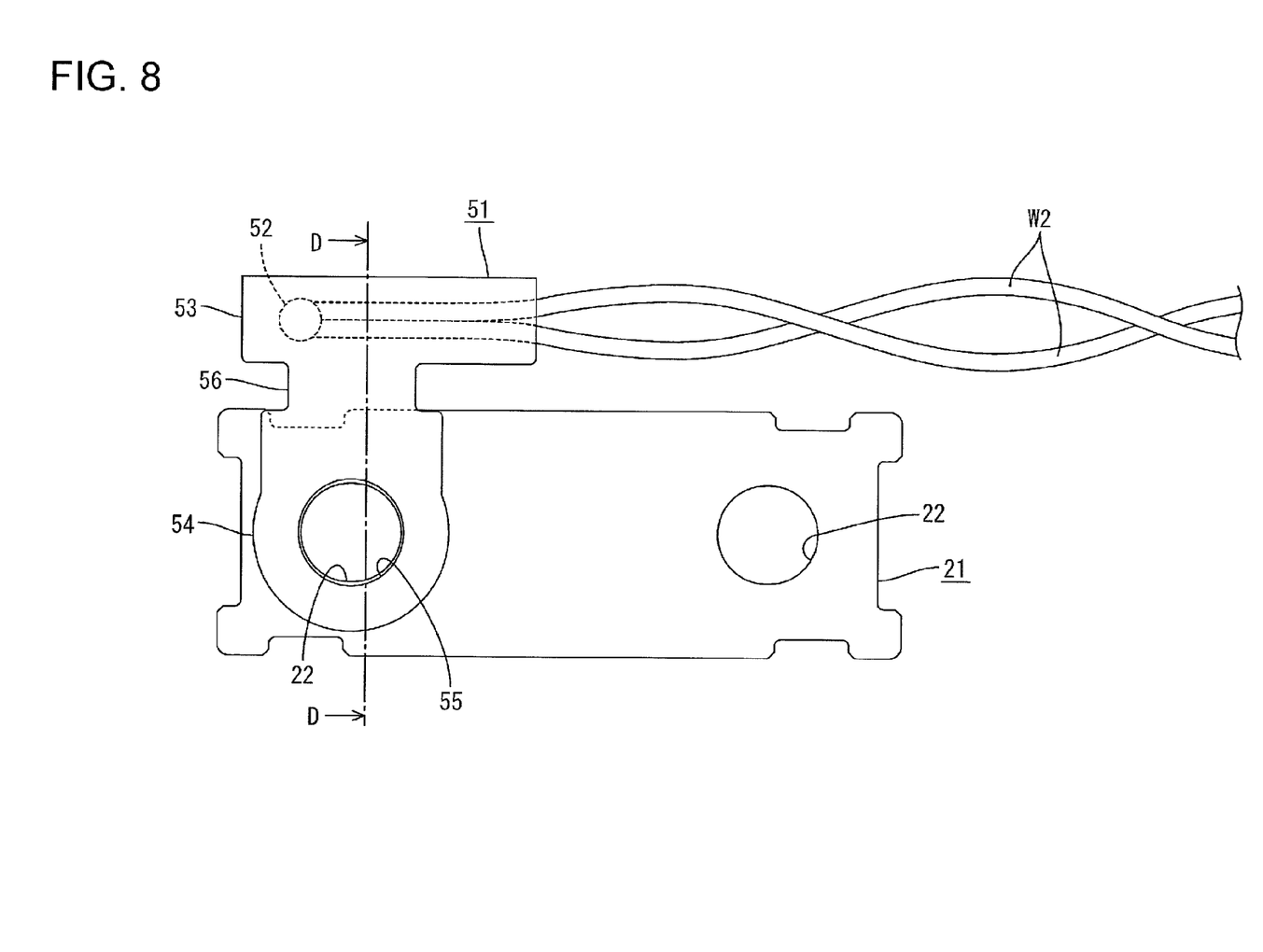
FIG. 8 is a partial plan view illustrating a temperature detecting member.

Each connection member 21 is formed by pressing a plate material made of metal such as copper, copper alloy, stainless steel (SUS), aluminum, or the like into a predetermined shape and on the whole has a substantially rectangular shape, as shown in FIGS. 5 and 8. The surface of the connection member 21 may be plated with metal such as tin or nickel. The connection member 21 has a pair of terminal through-holes 22 that are substantially circular and through which the bolts 16 for connecting the connection member to the electrode terminals 12A and 12B are inserted, the terminal through-holes 22 penetrating through the connection member 21.

The terminal through-holes 22 have a hole diameter that is set to be slightly larger than that of the electrode terminals 12A and 12B. By the bolts 16 being inserted into the terminal through-holes 22 and the threads of the bolts 16 being screwed into the holes of the electrode terminals 12A and 12B so as to sandwich the connection member 21 between the heads of the bolts 16 and terminal blocks, the adjacent electrode terminals 12A and 12B, and the connection member 21 are electrically connected to each other.

Note that a connection member 21 that is a target for temperature detection is configured to be sandwiched, together with a detection section 54 of a temperature detecting member 51, between the heads of bolts 16 and terminal blocks.

Insulating Protector 23

The insulating protector 23 is formed by coupling a plurality of coupling units 23A, and has an elongated shape extending in the direction (the horizontal direction in FIG. 1) in which the cell packs 11 are lined up, as shown in FIG. 1. In the insulating protector 23, a plurality of connection member holding sections 24 are provided in an arrangement of two lines in the longitudinal direction, the connection member holding sections 24 opening upward and including a separation wall that separates the inside from the outside and is capable of holding the connection member 21. Each connection member holding section 24 is provided with a plurality of pressing pieces 29 for preventing the corresponding connection member 21 from being removed upward.

Of the connection member holding sections 24 arranged in two lines, the connection member holding sections 24 that are arranged to the rear of FIG. 5 each have an outer wall 24A that partially has a cutout at a position that corresponds to the position of the electrode terminal 12A or 12B. The cutout of the outer wall 24A of the corresponding connection member holding section 24 serves as a positioning section 24B for receiving and positioning a held section 56, which is formed between an element accommodating section 53 and the detection section 54 of the temperature detecting member 51 and has a width smaller than that of the detection section 54.

Figure 4:
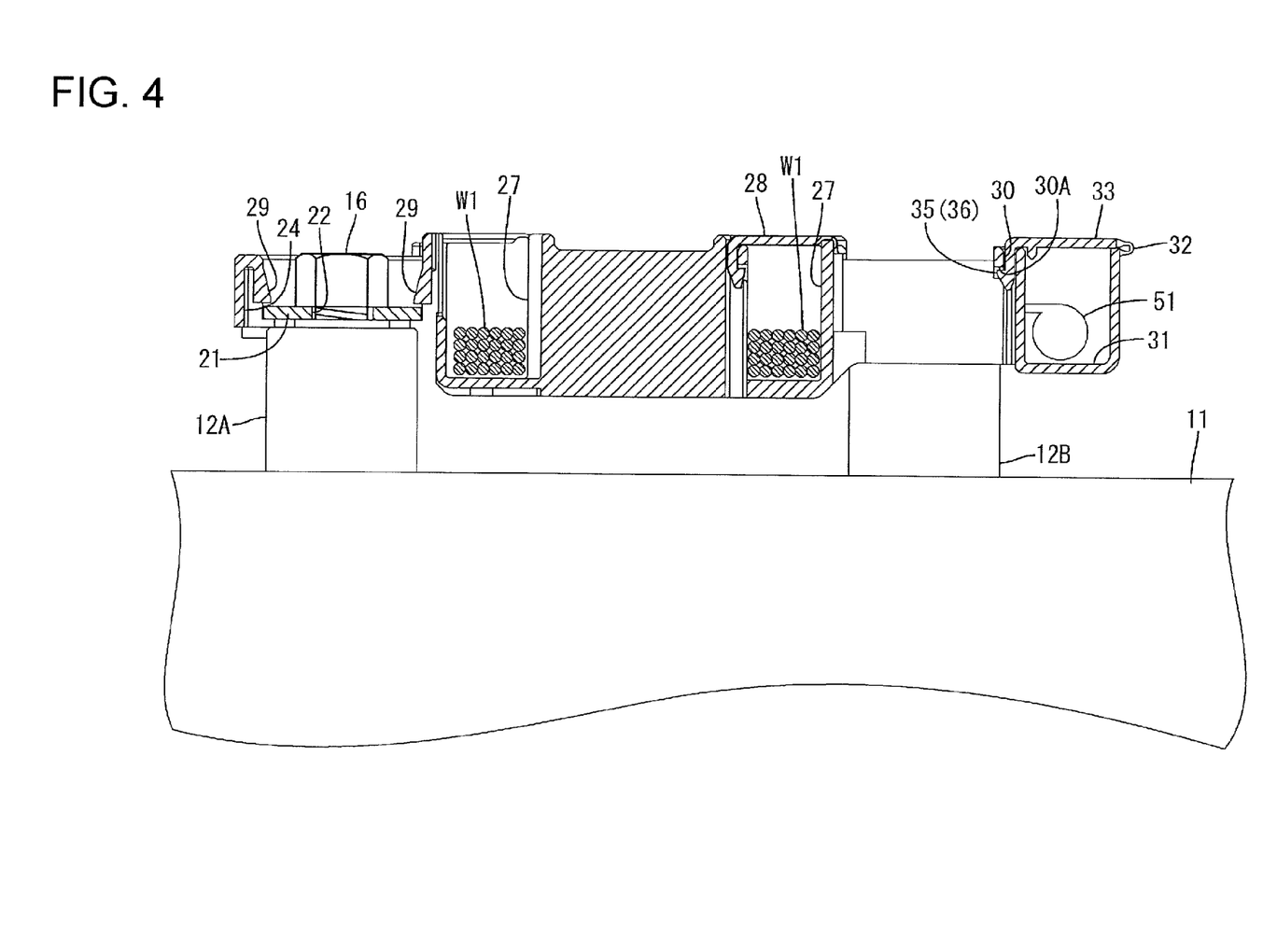
FIG. 4 is a partial cross-sectional view taken along the line B-B of FIG. 1.

Furthermore, with respect to the connection member holding sections 24 that are arranged to the rear of FIG. 5, cover latching holes 30 for latching the covers 33 (an example of a cover) that cover the receiving groove 31 are provided between adjacent connection member holding sections 24. Each cover latching hole 30 has, on its hole wall, a latching recess 30A into which a lock protrusion 35 (an example of latched section) provided on the cover 33, as shown in FIG. 4.

Furthermore, as shown in FIG. 5, the receiving grooves 31 for receiving the element accommodating section 53 of the temperature detecting member 51 are provided outside the connection member holding sections 24 arranged to the rear of FIG. 5.

Each receiving groove 31 is formed extending in the direction (the horizontal direction in the drawing) in which the cell packs 11 are lined up. In the receiving groove 31, as shown in FIG. 5, the element accommodating section 53 and electric wires W2 that are led out from the element accommodating section 53 are arranged. The receiving groove 31 opens upward.

Connector holding sections 26 are provided between the connection member holding sections 24 arranged in two lines, and electric wire accommodating grooves 27 are provided between the connector holding sections 26 and each line of the connection member holding sections 24.

The electric wire accommodating grooves 27 are configured to accommodate electric wires W1 connected to ends on one side of the terminals 47 that are accommodated in terminal accommodating sections 45 of the connectors 40 that are held by the connector holding sections 26.

As shown in FIG. 5, each of the two electric wire accommodating grooves 27 has a pair of groove-wall sections 27A and 27B, and a bottom 27C that connects the pair of groove-wall sections 27A and 27B, and is capable of accommodating a plurality of electric wires W1 therein.

Furthermore, electric wire fixing sections 28 are provided on the upper edges of the electric wire accommodating groove 27, the electric wire fixing sections 28 restricting protrusion of the electric wires W1 from the electric wire accommodating groove 27 and extending from one groove-wall section 27A to the other groove-wall section 27B. Each electric wire fixing section 28 is provided at a position between adjacent connection member holding sections 24.

In the present embodiment, the connector holding sections 26 are provided between the two electric wire accommodating grooves 27. The shape of each connector holding section 26 extends along the outer periphery of a connector 40.

Cover 33

Meanwhile, in the present application, the covers 33 that cover an open section of the receiving groove 31 via the hinges 32. According to the present embodiment, each cover 33 is formed into one piece with the insulating protector 23 via the hinges 32. The cover 33 is made from an insulating material, as with the insulating protector 23.

The cover 33 is provided along the receiving groove 31, and has, on that part of the cover 33 that corresponds to the positioning section 24B, a restricting wall 34 (an example of a restricting member) that is fitted into the positioning section 24B and presses the temperature detecting member 51 from above so as to restrict movement of the temperature detecting member 51. In the present embodiment, the cover 33 and the restricting wall 34 are formed into one piece.

The cover 33 has projecting lock pieces 36 that are provided with the lock protrusion 35 (an example of a latched section) that is latched into a cover latching hole 30 (insulating protector 23) provided between adjacent connection member holding sections 24.

Connector 40

As shown in FIG. 1, the connector 40 held by the connector holding section 26 is configured to accommodate four terminals 47. The connector 40 is provided with a housing 41 in the shape of a substantially rectangular parallelepiped, and four terminals 47 housed in the housing 41.

The housing 41 is provided with a latching piece 42, which receives the latching protrusion 14 of the connector section 13 and is latched with respect to a single cell. The latching piece 42 has a latching hole 42A into which the latching protrusion 14 is fitted.

The housing 41 has a groove section 44 that receives the connector section 13. In the housing 41, four terminal accommodating sections 45 are formed in parallel to each other. Each terminal accommodating section 45 has, on its inner circumferential surface, a lance 46 that flexibly protrudes into the terminal accommodating section 45 and thereby engages with a terminal 47 accommodated in the terminal accommodating section 45.

The terminals 47 housed in the housing 41 are so-called female-type terminals 47, and each have, on one end (upper end in FIG. 2) thereof, barrel sections 48 and 49 to which the electric wires W1 are connected and, on the other end (lower end in FIG. 2) thereof, a connection section 50 that is box-shaped and connectable to a single cell.

The barrel sections 48 and 49 encompasses a wire barrel section 48 that is crimped to an exposed core wire (not shown) exposed at an end of an electric wire W1, and an insulation barrel section 49 that is crimped to a part of the electric wire W1 that is covered with an insulation covering, although the details thereof are not shown in the drawings.

The connection section 50 is provided with elastic contact pieces (not shown), and by the elastic contact pieces being brought into contact with the terminals 15 of the connector section 13, the single cell and the terminals 47 of the connector 40 are electrically connected to each other. Furthermore, an engagement section (not shown) that engages with the lance 46 is provided between the connection section 50 and the barrel sections 48 and 49 of the terminals 47.

The terminals 47 accommodated in the connector 40 are terminals 47 for detecting the voltage of a single cell. The electric wires W1 connected to the terminals 47 are led out from a rear wall 45A (the wall section arranged on the upper side of FIG. 2) of the terminal accommodating section 45 to the outside of the housing 41, and are connected to, for example, a control unit (not shown) such as an ECU. The electric wires W1 are arranged in the electric wire accommodating groove 27 located on the side opposite to the latching piece 42 of the housing 41.

Temperature Detecting Member 51

The temperature detecting member 51 includes an element accommodating section 53, which accommodates a temperature detecting element 52 and through which an electric wire W2 is led, and a detection section 54.

The element accommodating section 53 is tubular and accommodates therein the temperature detecting element 52 to which electric wires W2 are connected. The temperature detecting element 52 is constituted by a thermistor, for example. A PTC thermistor or an NTC thermistor may suitably be selected as the thermistor. Furthermore, the temperature detecting element 52 is not limited to a thermistor, and any element may suitably be selected as long as it can detect temperatures.

A pair of electric wires W2 are connected to the temperature detecting element 52, and are led from the element accommodating section 53 to the outside. The electric wires W2 are connected to an external circuit (not shown) and a signal from the temperature detecting element 52 is transmitted to the external circuit via the electric wires W2. The external circuit is arranged in, for example, a battery ECU (not shown), and is configured to detect the temperature of the connection member 21 based on the signal from the temperature detecting element 52.

The detection section 54 is flat-plate shaped, and the held section 56, which is formed between the element accommodating section 53 and the detection section 54 and has a width smaller than that of the detection section 54, is a part that is received and held by the positioning section 24B formed in the insulating protector 23. The detection section 54 and the element accommodating section 53 are connected to each other via the held section 56.

The detection section 54 has a terminal insertion hole 55 through which the electrode terminal 12A or 12B can be inserted. The electrode terminal 12A or 12B is configured to be inserted into a hole that is formed by the terminal insertion hole 55 of the detection section 54 overlapping the terminal through-hole 22 of the connection member 21.

Figure 9:
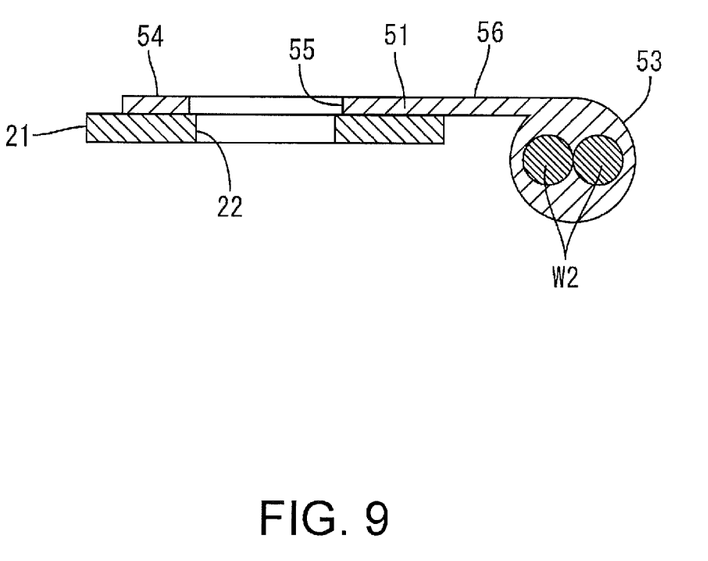
FIG. 9 is a cross-sectional view taken along the line D-D of FIG. 8.

As shown in FIG. 9, the element accommodating section 53 has a thickness that is larger than that of the detection section 54. In the present embodiment, the element accommodating section 53 is arranged in parallel to a line X (see FIG. 5) connecting the shaft centers P of adjacent two electrode terminals 12A and 12B that are connected to each other by the connection member 21.

The temperature detecting member 51 according to the present embodiment is produced by processing a plate material made of metal such as copper, copper alloy, stainless steel (SUS), aluminum, or the like. The temperature detecting member 51 is produced by a method in which, for example, a metal plate material is pressed into a predetermined shape, the resultant material is subjected to bending or the like so as to form a tubular element accommodating section 53, the temperature detecting element 52 to which electric wires W2 are connected is put into the element accommodating section 53, and an insulating resin (for example, an epoxy resin) is then cast into the element accommodating section 53 and is fixed.

Method for Assembling the Wiring Module 20

When the wiring module 20 according to the present embodiment is assembled, the connection members 21 are first accommodated in the connection member holding sections 24 of the insulating protector 23.

Then, the terminals 47 to one end of which electric wires W1 are connected are accommodated in the terminal accommodating sections 45 of the connectors 40, and the connectors 40 are attached to the connector holding sections 26 by being fitted into the connector holding sections 26.

Figure 10:
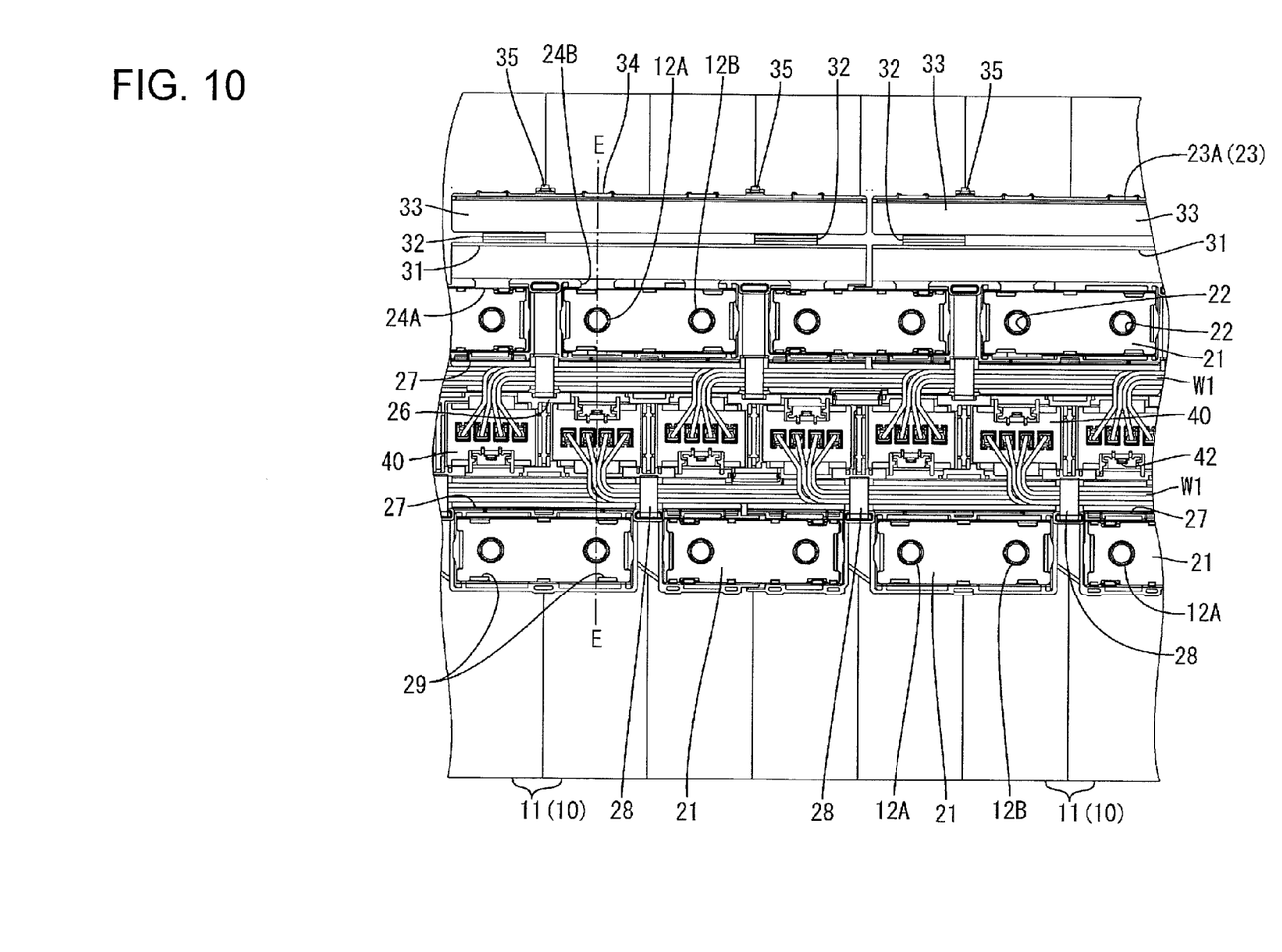
FIG. 10 is a partial plan view illustrating the state in which the wiring module is arranged on a single cell group.
Figure 11:
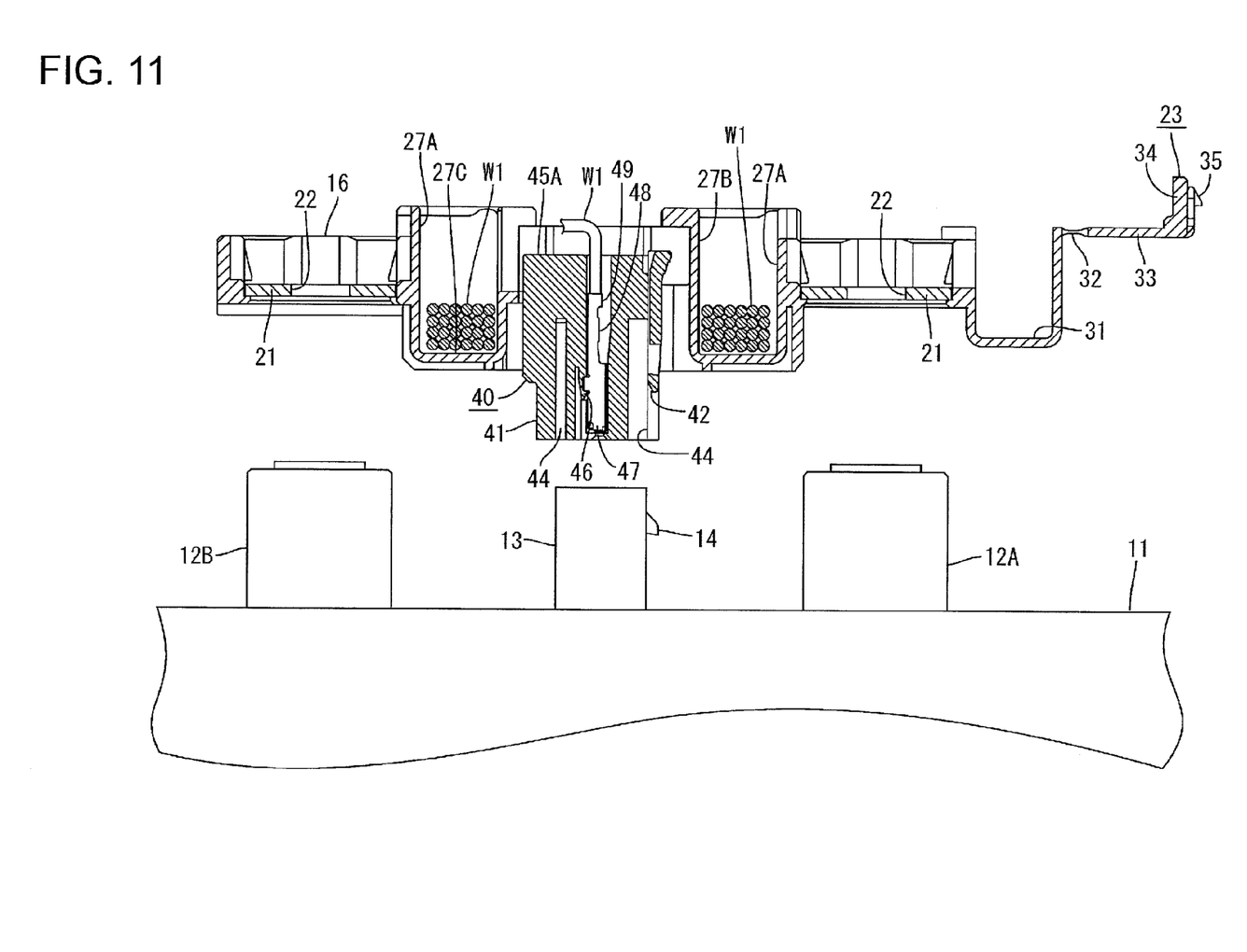
FIG. 11 is a partial cross-sectional view taken along the line E-E of FIG. 10.

Then, the electric wires W1 connected to the connectors 40 are accommodated in the electric wire accommodating grooves 27 (see FIGS. 10 and 11). When accommodating the electric wires W1, electric wires W1 are accommodated in the electric wire accommodating groove 27 that is located on the side opposite to the latching piece 42 of the housing 41 of the connector 40 to which those electric wires W1 are connected.

Then, the temperature detecting members 51 are attached. While the element accommodating sections 53 of the temperature detecting members 51 are positioned so as to align with the corresponding receiving groove 31 and the terminal insertion holes 55 of the detection sections are arranged so as to overlap the terminal through-holes 22 of the connection members 21, the held sections 56 are fitted into the positioning sections 24B of the insulating protector 23.

Accordingly, the held sections 56 are fitted into the positioning sections 24B of the insulating protector 23, the element accommodating sections 53 are received by the receiving groove 31, and the detection sections 54 and the connection members 21 are brought into surface-contact (areal contact) with each other. When the held sections 56 are received by the positioning sections 24B, the temperature detecting members 51 are positioned in the insulating protector 23. In this state, the temperature detecting members are movable in the vertical direction. Note that the electric wires W2 connected to the temperature detecting elements 52 are routed in the receiving grooves 31.

Figure 3:
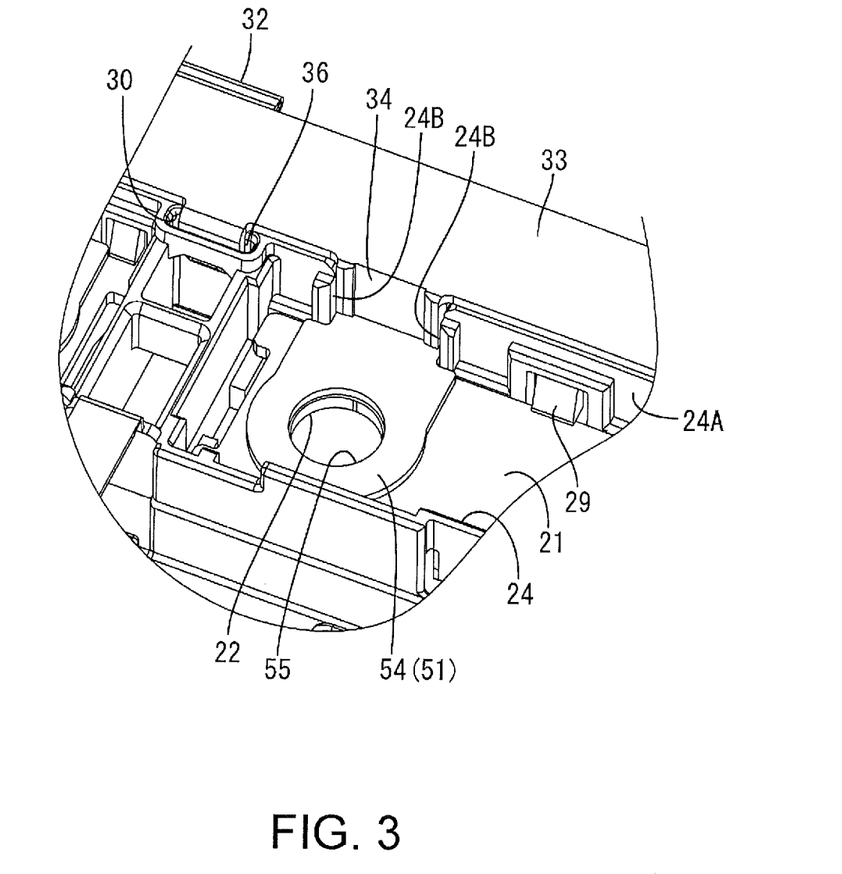
FIG. 3 is a partial perspective view illustrating the battery module.

Then, when the covers 33 are folded at the hinges 32 to cover the open section of the receiving grooves 31, the restricting walls 34 of the covers 33 are fitted into the positioning sections 24B, and presses the temperature detecting members 51 from above so as to restrict the (upward) movements of the temperature detecting members 51 (see FIGS. 2 and 3). Then, when being brought into contact with the hole edge of the cover latching holes 30, the lock protrusion sections 35 of the covers 33 deform in the direction to the outside, and flexibly return to be latched when reaching the latching recesses 30A of the cover latching holes 30.

When the covers 33 are latched into the resin protector 23 in the state in which movement of the temperature detecting members 51 is restricted by the restricting walls 34, the temperature detecting members 51 are held by the insulating protector 23 in the state in which movement is restricted.

Method of Attaching to the Single Cell Group 10

A plurality of cell packs 11 are lined up so that adjacent electrode terminals 12A and 12B have different polarities, and the wiring module 20 in which the temperature detecting members 51, the connection members 21, and the connectors 40 are arranged is attached so as to cover the surfaces of the cell packs 11 on which the electrode terminals 12A and 12B are formed, with the terminal through-holes 22 of the connection members 21 aligned with the electrode terminals 12A and 12B. Accordingly, the connector sections 13 of the cell packs 11 are arranged in the connector holding sections 26.

Then, the battery connecting bolts 16 are connected to the sections in the shape of holes of the electrode terminals 12A and 12B inserted through the connection members 21 and the detection section 54. After all the bolts 16 are connected thereto, the connectors 40 are pressed down to realize the state in which the connectors 40 and the single cells are electrically connected (see FIG. 6). When the process for connecting the bolts 16 and the process for connecting the connectors 40 end, the battery module M1 is completed.

Functions and Effects of the Present Embodiment

In the present embodiment, when the temperature detecting member 51 for detecting the temperature of the connection member 21 is arranged so as to be in contact with the connection member 21 held by the connection member holding section 24 and then the cover 33 is attached, movement of the temperature detecting member 51 is restricted by the restricting wall 34.

Therefore, according to the present embodiment, it is possible to hold the temperature detecting member 51 in the state in which movement of the temperature detecting member 51 is restricted without providing separately a structure for holding the temperature detecting member 51 for insulating protector 23, suppressing, in the wiring module 20 including the temperature detecting members 51, an increase in size of the temperature detecting members 51.

Furthermore, according to the present embodiment, the restricting wall 34 is formed into one piece with the cover 33, and thus only with an operation for attaching the cover 33, movement of the temperature detecting member 51 is restricted by the restricting wall 34, making it possible to realize an easy operation for holding the temperature detecting member 51.

Furthermore, according to the present embodiment, since the cover 33 is provided with the lock protrusions 35 that are latched into the insulating protector 23, it is possible to maintain the state in which movement of the corresponding temperature detecting member 51 is restricted.

Moreover, according to the present embodiment, since the corresponding connection member holding section 24 has the positioning section 24B that is obtained by cutting out a part thereof, and is configured to receive and position the held section 56 (part thereof) of the temperature detecting member 51, without causing the problem of interring between the positioning section 24B and another member since the temperature detecting member 51 is received and positioned by the positioning section 24B.

Furthermore, according the present embodiment, the detection section 54 of the temperature detecting member 51 is connected, together with the connection member 21, to the electrode terminals 12A and 12B, thus achieving an excellent work efficiency of the connecting procedure.

Other Embodiments

The present application is not limited to the embodiments described with reference to the foregoing description and the drawings, and the technical scope of the present application may include, for example, the following embodiments.

(1) Although the foregoing embodiment shows the member in which the cover 33 and the insulating protector 23 are formed into one piece, the cover and the resin protector may be separate members.

(2) Although the foregoing embodiment shows the member in which the restricting wall 34 (restricting member) and the cover 33 are formed into one piece, the restricting member and the cover may be separate members.

(3) Although the foregoing embodiment shows the cover 33 provided with the lock protrusions 35 that are latched to the insulating protector 23, the cover may be a cover that does not include the structure that is latched to the insulating protector.

(4) Although the foregoing embodiment shows a configuration in which the connection member holding section 24 has the positioning section 24B that is obtained by being cutting out a part thereof, and is configured to receive and position a part of the temperature detecting member 51, it is also possible that the connection member holding section 24 does not include the positioning section, or the connection member holding section is provided with a recess or the like so as to position the temperature detecting member.

Further, although specific embodiments have been illustrated and described herein, those of ordinary skill in the art appreciate that any arrangement which is calculated to achieve the same purpose may be substituted for the specific embodiments shown and that embodiments of the invention have other applications in other environments. The present application is intended to cover any adaptations or variations of the present inventions.

The following claims are in no way intended to limit the scope of embodiments of the invention to the specific embodiments described herein.

LIST OF REFERENCE NUMERALS

M1 . . . Battery module (power storage module)
10 . . . Single cell group (power storage element group)
11 . . . Cell pack (power storage element)
12A, 12B . . . Electrode terminal
20 . . . Wiring module
21 . . . Connection member
23 . . . Insulating protector
24 . . . Connection member holding section
24B . . . Positioning section (cutout section)
30 . . . Cover latching hole
30A . . . Latching recess
31 . . . Receiving groove
32 . . . Hinge
33 . . . Cover
34 . . . Restricting wall (restricting member)
35 . . . Lock protrusion (latched section)
36 . . . Lock piece
51 . . . Temperature detecting member
52 . . . Temperature detecting element
53 . . . Element accommodating section
54 . . . Detection section
55 . . . Terminal insertion hole
56 . . . Held section

The invention claimed is:

1. A wiring module to be attached to a power storage element group in which a plurality of power storage elements are lined up, each power storage element having a positive electrode terminal and a negative electrode terminal, the wiring module comprising:
   an insulating protector having a connection member holding section for holding a connection member that electrically connects adjacent electrode terminals;
   a temperature detecting member that is arranged so as to be in contact with the connection member held by the connection member holding section, and is configured to detect a temperature of the connection member;
   a cover configured to cover the insulating protector; and
   a restricting member configured to restrict movement of the temperature detecting member by covering the insulating protector with the cover.

2. The wiring module according to claim 1, wherein the restricting member is formed into one piece with the cover.

3. The wiring module according to claim 1, wherein the cover is provided with a latched section that is latched to the insulating protector.

4. The wiring module according to claim 1,
wherein the connection member holding section is provided with a positioning section that is obtained by cutting out a part of the connection member holding section, and is configured to receive and position a part of the temperature detecting member.

5. The wiring module according to claim 2,
wherein the cover is provided with a latched section that is latched to the insulating protector.

6. The wiring module according to claim 2,
wherein the connection member holding section is provided with a positioning section that is obtained by cutting out a part of the connection member holding section, and is configured to receive and position a part of the temperature detecting member.

7. The wiring module according to claim 3,
wherein the connection member holding section is provided with a positioning section that is obtained by cutting out a part of the connection member holding section, and is configured to receive and position a part of the temperature detecting member.

8. A wiring module to be attached to a power storage group in which a plurality of power storages are lined up, each power storage having a positive electrode terminal and a negative electrode terminal, the wiring module comprising:
   a connector that electrically connects adjacent electrode terminals of the power storage group;
   an insulating protector having a connection member holding section that holds the connector;
   a temperature detector configured to be in contact with the connector held by the connection member holding section, and to detect a temperature of the connector;
   a cover configured to cover the insulating protector; and
   a restrictor configured to restrict movement of the temperature detector by covering the insulating protector with the cover.

9. The wiring module according to claim 8,
wherein the restrictor is formed as an integral piece with the cover.

10. The wiring module according to claim 8,
wherein the cover includes a latched section configured to be detachably latched to the insulating protector.

11. The wiring module according to claim 8,
wherein the connection member holding section includes a positioning section configured to receive and position a part of the temperature detector, the positioning section being a cutout in the connection member holding section.

12. The wiring module according to claim 1, wherein the temperature detecting member includes:
   an element accommodating section, which accommodates a temperature detecting element and through which an electric wire is led; and
   a detection section.

13. The wiring module according to claim 8, wherein the temperature detector includes:
   an element accommodating section, which accommodates a temperature detecting element and through which an electrical wire is led; and
   a detection section.

* * * * *